(12) United States Patent
Mactaggart

(10) Patent No.: US 8,890,595 B2
(45) Date of Patent: Nov. 18, 2014

(54) DYNAMIC CLOCK PHASE CONTROL ARCHITECTURE FOR FREQUENCY SYNTHESIS

(71) Applicant: Fmax Technologies, Inc., Eden Prairie, MN (US)

(72) Inventor: Iain Ross Mactaggart, Eden Prairie, MN (US)

(73) Assignee: Fmax Technologies, Inc., Eden Prairie, MN (US)

( * ) Notice: Subject to any disclaimer, the term of this patent is extended or adjusted under 35 U.S.C. 154(b) by 0 days.

(21) Appl. No.: 13/895,849

(22) Filed: May 16, 2013

(65) Prior Publication Data

US 2013/0307602 A1 Nov. 21, 2013

Related U.S. Application Data

(60) Provisional application No. 61/688,496, filed on May 16, 2012.

(51) Int. Cl.
*H03K 3/00* (2006.01)
*H03H 11/16* (2006.01)
*H03K 5/13* (2014.01)
*H03L 7/16* (2006.01)

(52) U.S. Cl.
CPC ... *H03L 7/16* (2013.01); *H03K 5/13* (2013.01)
USPC ............ 327/231; 327/291; 327/298; 327/299

(58) Field of Classification Search
USPC .................. 327/231, 291, 298, 299
See application file for complete search history.

(56) References Cited

U.S. PATENT DOCUMENTS

2002/0021775 A1* 2/2002 Dietl et al. ................. 375/354
2008/0164930 A1* 7/2008 Rausch ..................... 327/298
2012/0187991 A1* 7/2012 Sathe et al. ................. 327/158

* cited by examiner

*Primary Examiner* — John Poos
(74) *Attorney, Agent, or Firm* — Schwegman Lundberg & Woessner, P.A.

(57) ABSTRACT

Embodiments of a device and circuit implementing a digitally controlled oscillator with reduced analog components. In an example, the digitally controlled oscillator can include a phase accumulator controlled by a stall circuit to selective stall the phase accumulator. In some examples, the digitally controlled oscillator can include a phase select circuit to select multiple phases of a phase select circuit based on the output of the phase accumulator. In some examples, these selected phases can then be used by a phase interpolator to generate a synthetic clock signal.

17 Claims, 1 Drawing Sheet

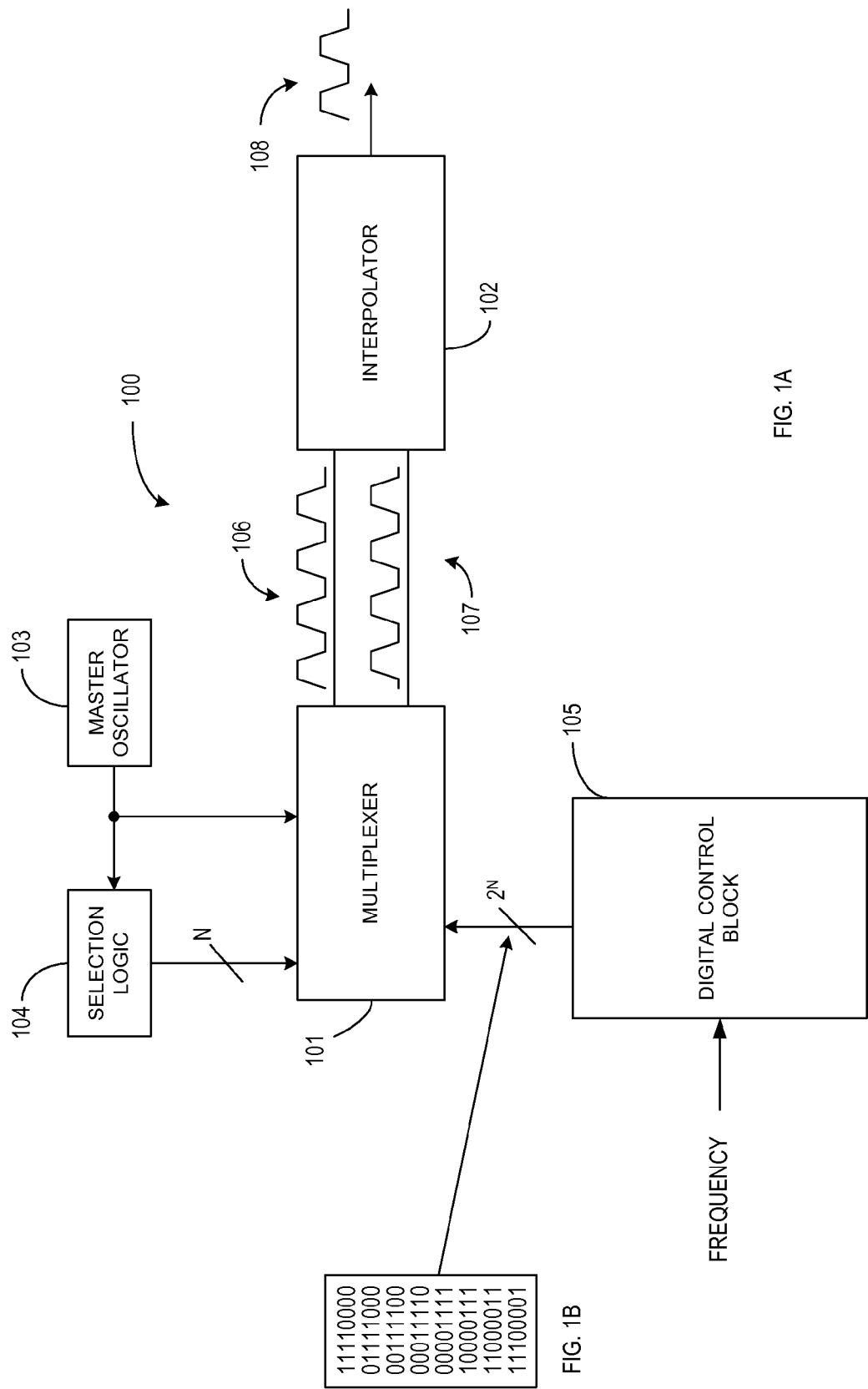

DYNAMIC CLOCK PHASE CONTROL ARCHITECTURE FOR FREQUENCY SYNTHESIS

PRIORITY APPLICATION

This application claims the benefit of priority under 35 U.S.C. 119(e) to Mactaggart, U.S. Provisional Patent Application Ser. No. 61/688,496, filed on May 16, 2012, which is incorporated herein by reference in its entirety.

BACKGROUND

Conversion of a digital number into a clock signal having a frequency that has a mathematical relationship to (e.g., proportional) the digital number is a widely used technique in modern electronics. One circuit that can make use of this conversion is a phase-locked loop (PLL). A digital PLL, for example, can convert the digital number that represents clock frequency into a voltage or current using a digital-to-analog converter (D2A) and then can use the resulting analog voltage or current to control an analog voltage or current controlled oscillator. Frequency synthesis can include dynamic adjustment of a phase of a fixed (master) oscillator master effected under digital control. However, current phase adjustment techniques lack the accuracy necessary to prevent the generation of excess jitter or spurious frequencies.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 1A and 1B illustrate generally an example phase control engine.

DETAILED DESCRIPTION

The present inventor has recognized apparatus and methods for accurately adjusting a master oscillator on a cycle-by-cycle basis to synthesize frequencies. Existing delay locked loop circuits, such as that referred to in U.S. Pat. No. 5,838,755, enable digitally selected phases for a synthetic frequency. However, delay mismatches of each stage of the circuit can be significant and can result in noise and jitter as a clock signal travels down the delay line. In certain examples of the present subject matter, a phase control engine for frequency synthesis can include a high speed multiplexer and a high speed phase interpolator that can minimize phase error to provide a low jitter synthetic clock signal. Programmable frequency generators providing signals with low phase jitter can simplify, improve or expand operating windows of many electronic systems. Such signals can be used for, but are not limited to, providing reference oscillator signals or radio frequency local oscillator signals.

FIG. 1A illustrates generally an example phase control engine 100 including a multiplexer 101 and a phase interpolator 102. The multiplexer 101 can receive a master clock signal from a master oscillator 103, selection inputs (N) from selection logic 104 coupled to the master oscillator 103, and a number of outputs ($2^N$) from a digital control block 105, such as a digital oscillator, and can serialize one or more synthetic clock signals. In certain examples, the selection logic 104 can include a counter. In certain examples, the digital control block 105 can include a digitally controlled oscillator such as that discussed in U.S. Pat. No. 8,319,563, filed Mar. 9, 2011, issued to the present inventor, and hereby incorporated by reference herein in its entirety. In certain examples, the digital control block 105 can provide a number ($2^N$) of over-sampled, synthesized clock signals. FIG. 1B illustrates generally example information of eight ($2^3$) outputs of an example digital controlled oscillator. In some examples, one or more of the over-sampled, synthesized clock signals can be offset in phase from one or more of the other over-sampled, synthesized clock signals.

In an example, the digital control block can include a phase accumulator such as a pipelined phase accumulator having a plurality of stages, and a stall circuit. The phase accumulator can include a plurality of registers for holding values between processing by the phase accumulator. In an example, one or more of the registers can hold/delay an input frequency control word from a frequency input register. This hold/delay can enable each stage of the phase accumulator to delay and process the values correspondingly. The phase accumulator can output one or more output bits based on an input (e.g., the frequency control word). In an example, the output bits can comprise the sum output from the adders in the phase accumulator. These output bits can include a carry-out (e.g., overflow) bit from the highest stage of the phase accumulator.

The stall circuit can be configured to selectively stall the accumulator from accepting an input (e.g., the frequency control word). In an example, the stall circuit can be controlled based on one or more output bits from the phase accumulator. For example, the stall circuit can receive one or more of the most significant bits (MSBs) of the output bits from the phase accumulator and can stall the phase accumulator based on those bits. In some examples, the stall circuit does not receive the MSBs of the output bits, but receives one or more of the next MSBs after the MSB. As should be understood, there can be several methods of controlling the stall circuit based on the output from the phase accumulator.

When stalled, output values from the accumulator can be held constant. In an example, the accumulator stall circuit can stall the accumulator by disabling one or more of the registers. When the registers are disabled, the accumulator does not accept an input from the frequency register. The stall circuit can stall the phase accumulator for one or more cycles based on the output of the phase accumulator.

In certain examples, one or more of the output bits of the phase accumulator can provide the over-sampled, synthetic clock signals, or phase control signals, to the multiplexer 101. The multiplexer 101 can provide a first multiplexed synthetic clock signal using the over-sampled, synthesized clock signals ($2^N$) and the selection inputs (N).

In certain examples, the multiplexer 101 can generate a second multiplexed synthetic clock signal by delaying the first multiplexed synthetic clock signal.

In certain examples, the first multiplexed synthetic clock signal and the second multiplexed synthetic clock signal can be referred to as the early clock signal 106 and the late clock signal 107, respectively. In some examples, the late clock signal 107 can be offset from the early clock signal 106 by one master oscillator period. In some examples, the late clock signal 107 can be offset from the early clock signal 106 by one-half of a master oscillator period.

In certain examples, an oversampling ratio associated with the phase control engine 100 can be adjusted in the digital control block 105 and can include, but is not limited to, sampling ratios of four or eight. In certain examples, the clocking rate of the digital control block 105 can be linked to the oversampling ratio to trade off power consumption with synthetic clock frequency. For example, low power operation can be achieved by modifying the oversampling ratio and operating the digital control block 105 at a reduced clock rate. In certain examples, duty cycle of the synthetic clock signal 108 can be modified under digital control. In certain examples, coarse phase adjustment of the synthetic signal 108 can be effected by digitally rotating the output bits of the digital control block 105 presented to the multiplexer 101 such that each coarse synthetic phase presented to the interpolator 102 includes no systematic phase error as each edge of the synthetic clock signal 108 is derived directly from a transition of the signal of the master oscillator 103. In certain examples, the multiplexer 101 can provide a clock signal (not shown) to drive the digital control block 105. In an example, the clock signal from the multiplexer 101 to the digital control block 105 can have a frequency of $1/2^N$ of the frequency of the master oscillator 103.

In certain examples, the interpolator 102 can receive the early and late clock signals 106, 107 and can interpolate the early and late clock signals 106, 107 to provide a synthetic clock signal 108 having a frequency determined by the digital control block 105 and having high phase accuracy. In certain examples, the interpolation can be achieved using a digital interpolator.

In certain examples, more than one phase control engine 100 can be coupled to the master oscillator 103 and the digital control block 105 to provide multiple synthesized clock signals 108. In such an example, the phase relationship between the multiple synthesized clock signals 108 can be precisely controlled and adjusted with little if any jitter or noise as each transition of the synthesized clock signals 108 is based on a transition of the master oscillator 103.

In certain examples, the interpolator can be programmed to weight the interpolation between the early and late clock signals 106, 107. In some examples, the interpolator can include a plurality of binary weighting inputs configured to allow the phase of the synthesized clock signal to be programmed between the phase of the early clock signal and the phase of the late clock signal such that the phase resolution of the synthetic clock signals 108 can be $1/2^N$ times the phase difference between the early clock signal 106 and the late clock signal 107. In an example, a master oscillator can have a frequency of 4 gigahertz and the multiplexer can provide a 8:1 frequency ratio using both edges of the master oscillator signal.

The frequency of the synthetic clock signals can be 1 gigahertz. If the interpolator included an 11 bit weighting input, the phase resolution can be about 125 picoseconds divided by 2048, or about 61 femtoseconds, where the 125 picoseconds represents a 45 degree phase difference between the early and late clock signals. It is understood that other master oscillator frequencies, frequency ratios and early and late clock signal offsets are possible without departing from the scope of the present subject matter. It is understood that other frequency ratios, weighting values and ranges of weighting values are possible without departing from the scope of the present subject matter.

Examples and Additional Notes

In Example 1, a synthetic frequency generator can include a multiplexer configured to receive a master oscillator signal having a frequency and a period, to receive a plurality of phase-control signals, to receive a plurality of selection signals synchronized with the master oscillator, and to provide first and second multiplexer clock signals having transitions synchronized with transitions of the master oscillator signal using a selection of the plurality of phase control signals, the selection based on the plurality of selection signals. The first and second multiplexer clock signals can be configured to include a phase offset, and wherein a period of the phase offset is equal to or greater than one half the period of the master oscillator signal. The synthetic frequency generator can include an interpolator configured to receive the first and second multiplexer clock signals and to interpolate an output clock signal using the first and second multiplexer clock signals, wherein the output clock signal includes an average frequency greater than zero.

In Example 2, the phase offset of Example 1 can be about 45 degrees.

In Example 3, the synthetic frequency generator of any one or more of Examples 1-2 optionally includes a digital control circuit configured to provide the plurality of phase control signals.

In Example 4, the multiplexer of any one or more of Examples 1-3 optionally is configured to provide a clock signal to drive the digital control block.

In Example 5, the digital control circuit of any one or more of Examples 1-4 optionally includes a phase accumulator configured to receive a first clock signal, the phase accumulator having a plurality of registers, wherein one or more of the registers are configured to accept a frequency control word and a stall circuit configured to selectively disable one or more of the registers in order to stall the phase accumulator.

In Example 6, the multiplexer of any one or more of Examples 1-5 optionally is configured to select one or more phases based on one or more output bits from the phase accumulator.

In Example 7, an average frequency of the master oscillator of any one or more of Examples 1-6 optionally is at least four times higher than an average frequency of the output clock signal.

In Example 8, an average frequency of the master oscillator of any one or more of Examples 1-7 optionally is at least eight times higher than an average frequency of the output clock signal.

In Example 9, the interpolator of any one or more of Examples 1-8 optionally is configured to receive a phase adjustment and to adjust a phase of the output clock signal from the phase of the first multiplexer clock signal to the phase of the second multiphase clock signal based on a value of the phase adjustment.

In Example 10, the phase adjustment of any one or more of Examples 1-9 optionally includes an integer value having up to 4096 discrete values.

In Example 11, a method of providing a synthetic clock signal having low phase noise can include receiving a master oscillator signal having a period and a frequency at a multiplexer, receiving a plurality of phase control signals at the multiplexer, receiving a plurality of selection signals at the multiplexer, each selection signal transition synchronized with a transition of the master oscillator signal, sequentially selecting one of the plurality of phase control signals using the plurality of selection signals, synchronizing a first multiplexer clock signal with the master oscillator signal using the sequentially selected one of the plurality of phase control signals, providing a second multiplexer clock signal having a phase offset from the first multiplexer clock signal, wherein a period of the phase offset is equal to or greater than one half the period of the master oscillator signal, and interpolating the first and second multiplexer clock signals to provide the synthetic clock signal having a frequency greater than zero.

In Example 12, the providing the first and second multiplexer clock signals of any one or more of Examples 1-11 optionally includes providing first and second multiplexer clock signals with a phase offset of about 45 degrees.

In Example 13, the frequency of the master oscillator of any one or more of Examples 1-12 optionally is at least four times greater than the frequency of the synthetic clock signal.

In Example 14, the frequency of the master oscillator of any one or more of Examples 1-13 optionally is at least eight times greater than the frequency of the synthetic clock signal.

In Example 15, the receiving a plurality of phase control signals of any one or more of Examples 1-14 optionally includes receiving a frequency control word at a plurality of registers of a phase accumulator.

In Example 16, the receiving a plurality of phase control signals of any one or more of Examples 1-15 optionally includes receiving a second oscillator signal at the phase accumulator.

In Example 17, the receiving a plurality of phase control signals of any one or more of examples 1-16 optionally includes selectively disabling one or more of the registers to stall the phase accumulator and to provide the phase control signals.

The above detailed description includes references to the accompanying drawings, which form a part of the detailed description. The drawings show, by way of illustration, specific embodiments in which the invention can be practiced.

These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like. The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A synthetic frequency generator comprising;
   selection logic configured to receive a master oscillator signal and to provide a plurality of selection signals synchronized with the master oscillator signal, the master oscillator signal having a frequency and a period;
   a multiplexer configured
      to receive a plurality of phase-control signals;
      to receive the plurality of selection signals; and
      to provide first and second multiplexer clock signals having transitions synchronized with transitions of the master oscillator signal using a serial selection of each of the plurality of phase control signals, the serial selection based on the plurality of selection signals;
      wherein the first and second multiplexer clock signals are configured to include a phase offset, and wherein a period of the phase offset is equal to or greater than one half the period of the master oscillator signal; and
   an interpolator configured to receive the first and second multiplexer clock signals and to interpolate an output clock signal using the first and second multiplexer clock signals, wherein the output clock signal includes an average frequency greater than zero.

2. The synthetic frequency generator of claim 1, wherein the phase offset is about 45 degrees.

3. The synthetic frequency generator of claim 1, including a digital control circuit configured to provide the plurality of phase control signals.

4. The synthetic frequency generator of claim 3, wherein the multiplexer is configured to provide a clock signal to drive the digital control block.

5. The synthetic frequency generator of claim 3, wherein the digital control circuit includes:
- a phase accumulator configured to receive a first clock signal, the phase accumulator having a plurality of registers, wherein one or more of the registers are configured to accept a frequency control word; and
- a stall circuit configured to selectively disable one or more of the registers in order to stall the phase accumulator.

6. The synthetic frequency generator of claim 5, wherein the multiplexer is configured to select one or more phases based on one or more output bits from the phase accumulator.

7. The apparatus of claim 1, wherein an average frequency of the master oscillator is at least four times higher than an average frequency of the output clock signal.

8. The apparatus of claim 1, wherein an average frequency of the master oscillator is at least eight times higher than an average frequency of the output clock signal.

9. The apparatus of claim 1, wherein the interpolator is configured to receive a phase adjustment and to adjust a phase of the output clock signal from the phase of the first multiplexer clock signal to the phase of the second multiphase clock signal based on a value of the phase adjustment.

10. The apparatus of claim 1, wherein the phase adjustment includes an integer value having up to 4096 discrete values.

11. A method of providing a synthetic clock signal having low phase noise, the method comprising,
- receiving a master oscillator signal at selection logic, the master oscillator signal having a period and a frequency;
- providing a plurality of selection signals synchronized with the master oscillator using the selection logic;
- receiving a plurality of phase control signals at the multiplexer;
- receiving the plurality of selection signals at the multiplexer
- sequentially selecting each of the plurality of phase control signals using the plurality of selection signals, wherein the sequentially selecting each of the plurality of phase control signals includes serializing the plurality of phase control signals using the multiplexer to provide a first multiplexer clock signal synchronized with the master oscillator signal;
- providing a second multiplexer clock signal having a phase offset from the first multiplexer clock signal, wherein a period of the phase offset is equal to or greater than one half the period of the master oscillator signal; and
- interpolating the first and second multiplexer clock signals to provide the synthetic clock signal having a frequency greater than zero.

12. The method of claim 11, wherein the providing the first and second multiplexer clock signals includes providing first and second multiplexer clock signals with a phase offset of about 45 degrees.

13. The method of claim 11, wherein the frequency of the master oscillator is at least four times greater than the frequency of the synthetic clock signal.

14. The method of claim 11, wherein the frequency of the master oscillator is at least eight times greater than the frequency of the synthetic clock signal.

15. The method of claim 11, wherein receiving a plurality of phase control signals includes receiving a frequency control word at a plurality of registers of a phase accumulator.

16. The method of claim 15, wherein receiving a plurality of phase control signals includes receiving a second oscillator signal at the phase accumulator.

17. The method of claim 16, wherein receiving a plurality of phase control signals includes selectively disabling one or more of the registers to stall the phase accumulator and to provide the phase control signals.

* * * * *

UNITED STATES PATENT AND TRADEMARK OFFICE
CERTIFICATE OF CORRECTION

PATENT NO.        : 8,890,595 B2  
APPLICATION NO.   : 13/895849  
DATED             : November 18, 2014  
INVENTOR(S)       : Mactaggart Page 1 of 1

It is certified that error appears in the above-identified patent and that said Letters Patent is hereby corrected as shown below:

In the Claims

Column 6, line 41, Claim 1, delete "comprising;" and insert --comprising:--, therefor Column 7, line 29, Claim 11, delete "comprising," and insert --comprising:--, therefor Column 7, line 36-37, Claim 11, delete "multiplexer" and insert --multiplexer;--, therefor Signed and Sealed this  
Thirtieth Day of June, 2015

Michelle K. Lee  
*Director of the United States Patent and Trademark Office*